| (12) | United States Patent<br>Huang et al. | (10) Patent No.: US 9,276,186 B2<br>(45) Date of Patent: Mar. 1, 2016 |
|---|---|---|

(54) LIGHT-EMITTING DEVICE AND MANUFACTURING METHOD THEREOF

(71) Applicant: Shenzhen China Star Optoelectronics Technology Co., Ltd., Shenzhen, Guangdong (CN)

(72) Inventors: Chong Huang, Guangdong (CN); Yuchun Hsiao, Guangdong (CN); Guofu Tang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/732,722

(22) Filed: Jun. 6, 2015

(65) Prior Publication Data

US 2015/0280091 A1 Oct. 1, 2015

Related U.S. Application Data

(62) Division of application No. 13/985,927, filed on Aug. 16, 2013, now Pat. No. 9,083,004.

(51) Int. Cl.
| *H01L 33/02* | (2010.01) |
|---|---|
| *H01L 33/64* | (2010.01) |
| *H01L 51/52* | (2006.01) |
| *H01L 33/42* | (2010.01) |
| *H01L 33/44* | (2010.01) |
| *H01L 33/50* | (2010.01) |
| *H01L 51/50* | (2006.01) |
| *H01L 51/56* | (2006.01) |
| *H01L 51/00* | (2006.01) |

(52) U.S. Cl.
CPC ............. *H01L 33/641* (2013.01); *H01L 33/02* (2013.01); *H01L 33/42* (2013.01); *H01L 33/44* (2013.01); *H01L 33/502* (2013.01); *H01L 51/5012* (2013.01); *H01L 51/5072* (2013.01); *H01L 51/5206* (2013.01); *H01L 51/529* (2013.01); *H01L 51/5253* (2013.01); *H01L 51/5262* (2013.01); *H01L 51/56* (2013.01); *H01L 51/0045* (2013.01); *H01L 2251/308* (2013.01)

(58) Field of Classification Search
CPC .......... H01L 33/02; H01L 33/60; H01L 33/62
USPC ................................................ 438/56, 72, 89
See application file for complete search history.

(56) References Cited

U.S. PATENT DOCUMENTS 9,083,004 B2 * 7/2015 Huang .................... H01L 33/02

\* cited by examiner

*Primary Examiner* — Michael Lebentritt
(74) *Attorney, Agent, or Firm* — Andrew C. Cheng

(57) ABSTRACT

A method for manufacturing a light-emitting device is provided, including: providing a base, which includes a heat dissipation layer made of graphene; forming a buffer layer on the heat dissipation layer; and forming a light emission unit on the buffer layer. The light-emitting device so made includes a graphene-made heat dissipation layer that effectively dissipates away heat emitting from an emissive layer of the light emission unit so as to effectively reduce the temperature of the light-emitting device and extend the service life of the light-emitting device. Particularly, when the light-emitting device is a light-emitting diode, the emissive layer thereof is a quantum dot emissive layer for effectively improving color saturation of the light-emitting diode and enhancing color displaying performance of the light-emitting diode.

8 Claims, 3 Drawing Sheets

LIGHT-EMITTING DEVICE AND MANUFACTURING METHOD THEREOF

CROSS REFERENCE TO RELATED APPLICATIONS

This is a divisional application of co-pending patent application Ser. No. 13/985,927, "Light-Emitting Device and Manufacturing Method Thereof", filed on Aug. 16, 2013.

BACKGROUND OF THE INVENTION

1. Field of the Invention

The present invention relates to the field of light-emitting devices, and in particular to a method for manufacturing a light-emitting device that has excellent heat dissipation performance.

2. The Related Arts

Light-emitting diodes (LEDs) and organic electroluminescent displays (OELDs) are two commonly used light-emitting devices at present.

The light-emitting diode comprises a semiconductor P-N junction structure to cause injections of minority charge carriers (electrons or holes) and to give of light through recombination of the minority charge carriers. In other words, if a positive voltage is applied to a specific element of the semiconductor, the electrons and the holes, when passing through an intermediate structure between an anode and a cathode, re-combine with each other. Such a state has a energy less than that of the state where the electrons and the holes are separate from each other and thus, emission of light results due to the difference of energy at this moment.

The organic electroluminescence display comprises thin coatings of organic materials on a glass substrate, so that when an electrical currently is conduct to pass, the organic coatings get luminous.

A currently available white LED generally comprises a blue die with an external package of yellow YAG fluorescent powder so as to result in a combination of lights to generate a white light; however, the color rendering index thereof is low. Further, the base layer of an LED often comprises sapphire, which has relatively low thermal conductivity (generally less than 50 W/m·K) and this leads to poor heat dissipation of the LED, thus affecting the luminous efficiency and lifespan of the LED.

Similarly, the glass substrate of the OLED is also of thermal conductivity that is not high, similarly suffering the issue of heat dissipation.

SUMMARY OF THE INVENTION

An object of the present invention is to provide a light-emitting device that has excellent heat dissipation performance, an extended life of service, and improved color displaying performance.

Another object of the present invention is to provide a manufacturing method of a light-emitting device, which has a simple process and which makes a light-emitting device having excellent heat dissipation performance and an extended life of service, and the light-emitting device also showing improved color displaying performance.

To achieve the objects, the present invention provides a light-emitting device, which comprises: a heat dissipation layer, a buffer layer formed on the heat dissipation layer, and a light emission unit formed on the buffer layer. The heat dissipation layer is made of graphene.

The light emission unit comprises: an electron transporting layer formed on the buffer layer, an emissive layer formed on the electron transporting layer, an N type ohmic contact electrode formed on the electron transporting layer and located at one side of the emissive layer, a hole transporting layer formed on the emissive layer, a transparent conductive layer formed on the hole transporting layer, and a P type ohmic contact electrode formed on the transparent conductive layer.

The emissive layer is a quantum dot emissive layer.

The transparent conductive layer is an indium tin oxides layer.

The light emission unit comprises: an anode formed on a buffer layer, a hole transporting layer formed on the anode, an organic emissive layer formed on the hole transporting layer, an electron transporting layer formed on the organic emissive layer, and a cathode formed on the electron transporting layer.

A manufacturing method of a light-emitting device comprises the following steps:

(1) providing a base, wherein the base comprises a heat dissipation layer and the heat dissipation layer is made of graphene;

(2) forming a buffer layer on the heat dissipation layer; and (3) forming a light emission unit on the buffer layer.

The light emission unit comprises: an electron transporting layer formed on the buffer layer, an emissive layer formed on the electron transporting layer, an N type ohmic contact electrode formed on the electron transporting layer and located at one side of the emissive layer, a hole transporting layer formed on the emissive layer, a transparent conductive layer formed on the hole transporting layer, and a P type ohmic contact electrode formed on the transparent conductive layer.

The emissive layer is a quantum dot emissive layer.

The transparent conductive layer is an indium tin oxides layer.

The light emission unit comprises: an anode formed on a buffer layer, a hole transporting layer formed on the anode, an organic emissive layer formed on the hole transporting layer, an electron transporting layer formed on the organic emissive layer, and a cathode formed on the electron transporting layer.

A manufacturing method of a light-emitting device comprises the following steps:

(1) providing a base, wherein the base comprises a heat dissipation layer and the heat dissipation layer is made of graphene;

(2) forming a buffer layer on the heat dissipation layer; and (3) forming a light emission unit on the buffer layer;

wherein the light emission unit comprises: an electron transporting layer formed on the buffer layer, an emissive layer formed on the electron transporting layer, an N type ohmic contact electrode formed on the electron transporting layer and located at one side of the emissive layer, a hole transporting layer formed on the emissive layer, a transparent conductive layer formed on the hole transporting layer, and a P type ohmic contact electrode formed on the transparent conductive layer.

The emissive layer is a quantum dot emissive layer.

The transparent conductive layer is an indium tin oxides layer.

The efficacy of the present invention is that the present invention provides a light-emitting device and a manufacturing method thereof, in which a heat dissipation layer is made of graphene to effectively dissipate away the heat emitting from the emissive layer so as to effectively reduce the temperature of the light-emitting device and extend the service life of the light-emitting device. Particularly, when the light-emitting device is a light-emitting diode, the emissive layer thereof is a quantum dot emissive layer for effectively improving color saturation of the light-emitting diode and enhancing color displaying performance of the light-emitting diode.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
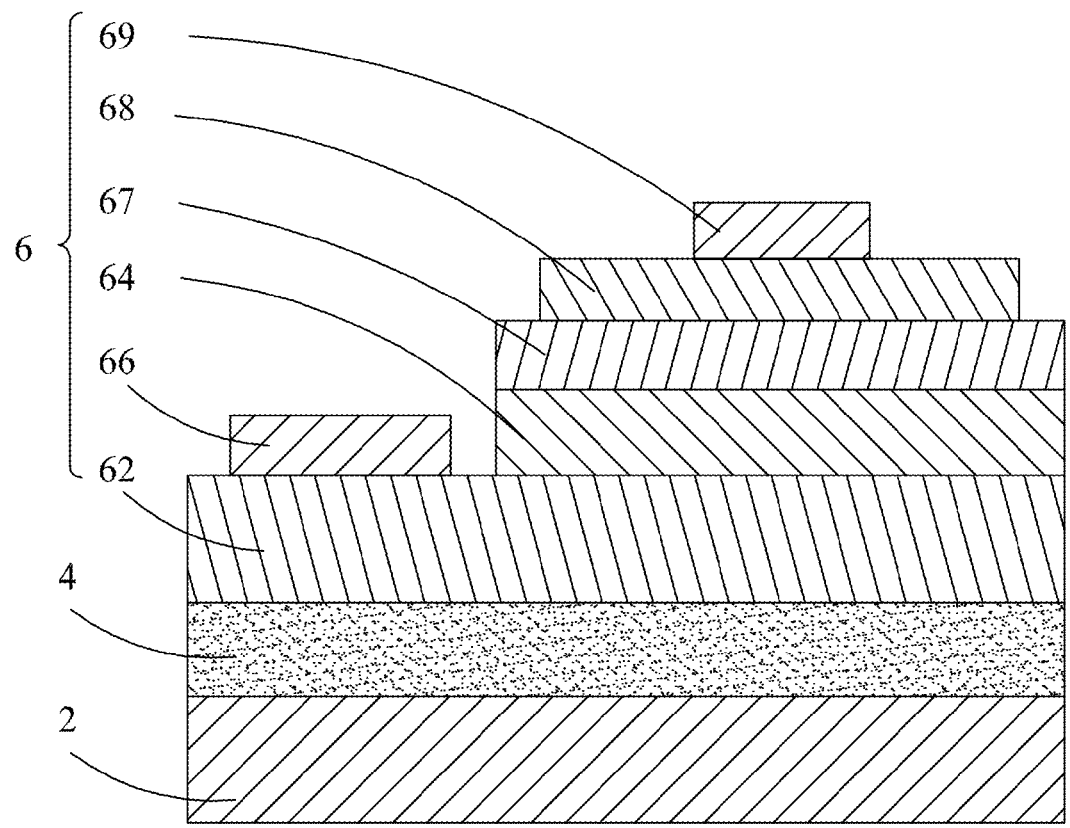
FIG. 1 is a schematic view showing the structure of a first embodiment of a light-emitting device according to the present invention.

Referring to FIG. 1, the present invention provides a light-emitting device, which comprises: a heat dissipation layer 2, a buffer layer 4 formed on the heat dissipation layer 2, and a light emission unit 6 formed on the buffer layer 4. The heat dissipation layer 2 is made of graphene.

Graphene has thermal conductivity of 4000-6000 W/m·K, which can effectively transfers heat emitting from the light emission unit 6 to the surroundings so as to effectively reduce the temperature of the light-emitting device ad extend the service life of the light-emitting device.

Referring to FIG. 1, in the instant embodiment, the light-emitting device comprises a light-emitting diode (LED) and the light emission unit 6 comprises: an electron transporting layer 62 formed on the buffer layer 4, an emissive layer 64 formed on the electron transporting layer 62, an N type ohmic contact electrode 66 formed on the electron transporting layer 62 and located at one side of the emissive layer 64, a hole transporting layer 67 formed on the emissive layer 64, a transparent conductive layer 68 formed on the hole transporting layer 67, and a P type ohmic contact electrode 69 formed on the transparent conductive layer 68.

In the instant embodiment, the emissive layer 64 is a quantum dot emissive layer, which effectively improves color saturation of the light-emitting diode and enhance color displaying performance of the light-emitting diode.

The transparent conductive layer 68 is an ITO (Indium Tin Oxides) layer.

Figure 2:
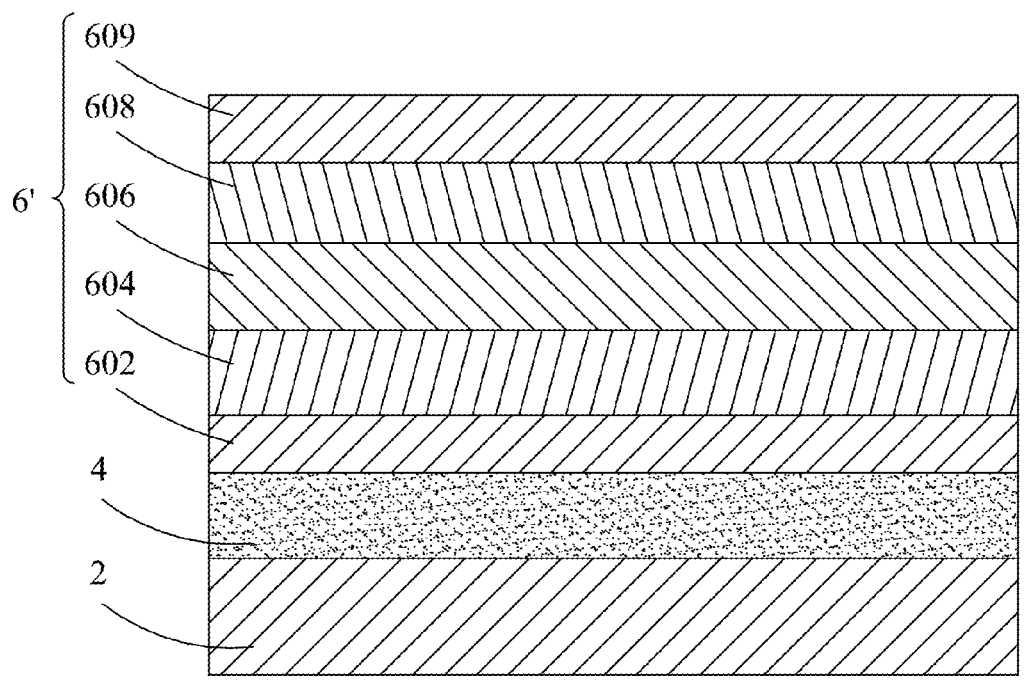
FIG. 2 is a schematic plan view showing the structure of a first embodiment of a light-emitting device according to the present invention.

Referring to FIG. 2, in another embodiment, the light-emitting device is an organic electroluminescence display (OLED), which comprises a light emission unit 6' comprising: an anode 602 formed on a buffer layer 4, a hole transporting layer 604 formed on the anode 602, an organic emissive layer 606 formed on the hole transporting layer 604, an electron transporting layer 608 formed on the organic emissive layer 606, and a cathode 609 formed on the electron transporting layer 608.

Figure 3:
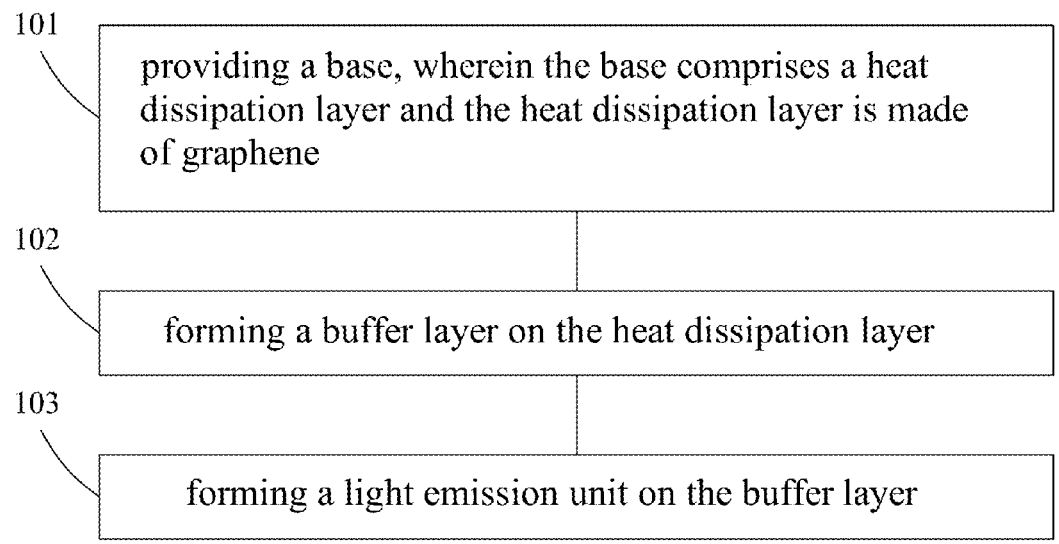
FIG. 3 is a flow chart illustrating a manufacturing method of a light-emitting device according to the present invention.

Referring to FIG. 3, with additional reference to FIGS. 1 and 2, a manufacturing method of a light-emitting device comprises the following steps:

Step 101: providing a base, wherein the base comprises a heat dissipation layer 2 and the heat dissipation layer 2 is made of graphene.

Graphene has thermal conductivity of 4000-6000 W/m·K, which can effectively transfers heat emitting from the light-emitting device to the surroundings so as to effectively reduce the temperature of the light-emitting device ad extend the service life of the light-emitting device.

Step 102: forming a buffer layer 4 on the heat dissipation layer 2.

Step 103: forming a light emission unit 6 on the buffer layer 4.

In the instant embodiment, the light-emitting device comprises a light-emitting diode (LED) and the light emission unit 6 comprises: an electron transporting layer 62 formed on the buffer layer 4, an emissive layer 64 formed on the electron transporting layer 62, an N type ohmic contact electrode 66 formed on the electron transporting layer 62 and located at one side of the emissive layer 64, a hole transporting layer 67 formed on the emissive layer 64, a transparent conductive layer 68 formed on the hole transporting layer 67, and a P type ohmic contact electrode 69 formed on the transparent conductive layer 68.

The emissive layer 64 is a quantum dot emissive layer, which effectively improves color saturation of the light-emitting diode and enhance color displaying performance of the light-emitting diode. The transparent conductive layer 68 is an ITO (Indium Tin Oxides) layer.

In another embodiment, the light-emitting device is an organic electroluminescence display (OLED), which comprises a light emission unit 6' comprising: an anode 602 formed on a buffer layer 4, a hole transporting layer 604 formed on the anode 602, an organic emissive layer 606 formed on the hole transporting layer 604, an electron transporting layer 608 formed on the organic emissive layer 606, and a cathode 609 formed on ∓ the electron transporting layer 608.

In summary, the present invention provides a light-emitting device and a manufacturing method thereof, in which a heat dissipation layer is made of graphene to effectively dissipate away the heat emitting from the emissive layer so as to effectively reduce the temperature of the light-emitting device and extend the service life of the light-emitting device. Particularly, when the light-emitting device is a light-emitting diode, the emissive layer thereof is a quantum dot emissive layer for effectively improving color saturation of the light-emitting diode and enhancing color displaying performance of the light-emitting diode.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a light-emitting device, comprising the following steps:
   providing a base, wherein the base comprises a heat dissipation layer made of graphene;
   forming a buffer layer on the heat dissipation layer; and
   forming a light emission unit on the buffer layer.

2. The method as claimed in claim 1, wherein the light emission unit comprises: an electron transporting layer formed on the buffer layer, an emissive layer formed on the electron transporting layer, an N type ohmic contact electrode formed on the electron transporting layer and located at one side of the emissive layer, a hole transporting layer formed on the emissive layer, a transparent conductive layer formed on the hole transporting layer, and a P type ohmic contact electrode formed on the transparent conductive layer.

3. The method as claimed in claim 2, wherein the emissive layer is a quantum dot emissive layer.

4. The method as claimed in claim 2, wherein the transparent conductive layer is an indium tin oxides layer.

5. The method as claimed in claim 1, wherein the light emission unit comprises: an anode formed on a buffer layer, a hole transporting layer formed on the anode, an organic emissive layer formed on the hole transporting layer, an electron transporting layer formed on the organic emissive layer, and a cathode formed on the electron transporting layer.

6. A method for manufacturing a light-emitting device, comprising the following steps:
   providing a base, wherein the base comprises a heat dissipation layer made of graphene;
   forming a buffer layer on the heat dissipation layer; and
   forming a light emission unit on the buffer layer;
   wherein the light emission unit comprises: an electron transporting layer formed on the buffer layer, an emissive layer formed on the electron transporting layer, an N type ohmic contact electrode formed on the electron transporting layer and located at one side of the emissive layer, a hole transporting layer formed on the emissive layer, a transparent conductive layer formed on the hole transporting layer, and a P type ohmic contact electrode formed on the transparent conductive layer.

7. The method as claimed in claim 6, wherein the emissive layer is a quantum dot emissive layer.

8. The method as claimed in claim 6, wherein the transparent conductive layer is an indium tin oxides layer.

\* \* \* \* \*